United States Patent
Kim

(10) Patent No.: US 7,164,614 B2
(45) Date of Patent: Jan. 16, 2007

(54) FUSE BOX, SEMICONDUCTOR MEMORY DEVICE HAVING THE SAME AND SETTING METHOD THEREOF

(75) Inventor: Keun-Kook Kim, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/024,462

(22) Filed: Dec. 30, 2004

(65) Prior Publication Data
US 2006/0002227 A1 Jan. 5, 2006

(30) Foreign Application Priority Data
Jun. 30, 2004 (KR) .................... 10-2004-0049957

(51) Int. Cl.
*G11C 7/00* (2006.01)
(52) U.S. Cl. .................................. 365/222; 365/225.7
(58) Field of Classification Search ................. 365/222
See application file for complete search history.

(56) References Cited

U.S. PATENT DOCUMENTS 6,064,619 A 5/2000 Ahn et al.
6,316,963 B1 11/2001 Yanagisawa
6,717,878 B1 * 4/2004 Hagura et al. .............. 365/211
6,731,558 B1 * 5/2004 Yamauchi et al. .......... 365/222
2004/0047205 A1 3/2004 Hazama et al.

* cited by examiner

Primary Examiner—Amir Zarabian
Assistant Examiner—Kretelia Graham
(74) Attorney, Agent, or Firm—McDermott Will & Emery LLP

(57) ABSTRACT

A semiconductor memory device includes: a TCSR generator for generating an oscillation pulse; a TCSR fuse box for adjusting an oscillation pulse period of the TCSR generator; an SSR generator for generating an SSR mode oscillation pulse; an SSR fuse box for adjusting an oscillation pulse period of the SSR generator; an SSR multiplier for multiplying the oscillation pulse period; an oscillation pulse selector for selecting a signal having a shorter period between output signals of the TCSR generator and the SSR multiplier; a TCSR multiplier for receiving an oscillation pulse of the oscillation pulse selector and multiplying a period of the oscillation pulse; a multiplier fuse box for adjusting the period of the TCSR multiplier; a mode selector for selecting one from the output signal of the oscillation pulse selector and the oscillation pulse of the SSR generator; and a bonding option block controlling the mode selector.

16 Claims, 2 Drawing Sheets

FUSE BOX, SEMICONDUCTOR MEMORY DEVICE HAVING THE SAME AND SETTING METHOD THEREOF

FIELD OF INVENTION

The present invention relates to a semiconductor memory device; and, more particularly, to a fuse box of a semiconductor memory device and a setting method thereof, in which the semiconductor memory device performs a refresh operation at a predetermined period.

DESCRIPTION OF PRIOR ART

Among the semiconductor memory devices, a dynamic random access memory (DRAM) is a volatile memory, so that data stored in a memory cell capacitor is erased after a predetermined time elapses. Accordingly, the DRAM performs a refresh operation so as to rewrite the data stored in a memory cell at a predetermined period. A compulsory refresh controls a refresh operation at an outside of the DRAM, and a self refresh controls a refresh operation at an inside of the DRAM. An auto refresh uses both the compulsory refresh and the self refresh.

The compulsory refresh considers a refresh period at an external device, such as a CPU or a chipset. Meanwhile, the self refresh must maintain a predetermined period, considering a time when the memory cell of the DRAM is erased. For this purpose, a refresh oscillation pulse is generated inside the DRAM. At this point, the refresh oscillation pulse has a period corresponding to a time interval required by the refresh. In this manner, the refresh operation is performed at a transition of the refresh oscillation pulse.

In general, it is preferable that the DRAM used in PC system uses a refresh oscillation pulse having a fixed interval. In the case of a DRAM for use in mobile equipment, such as a handheld phone, an unnecessarily frequent refresh is a factor of a power consumption. Accordingly, the DRAM for use in mobile equipment needs to have a refresh period as long as possible. The mobile equipment has a great change in temperature. If the temperature rises, the cell capacitor of the DRAM is discharged faster because mobility of electron increases.

For this reason, unlike a general DRAM, a conventional DRAM for use in mobile equipment is necessary to perform a temperature controlled self refresh (TCSR) mode in which the oscillation period increases as the temperature rises. Thus, the DRAM for use in mobile equipment includes a TCSR oscillation pulse generator. On the contrary, the general DRAM performs a standard self refresh (SSR) mode in which the variation of an oscillation period depending on the change in temperature is minimized. Thus, the general DRAM includes an SSR oscillation pulse generator.

However, if the general DRAM and the DRAM for use in mobile equipment are manufactured in different processes and/or different structures, it is wasteful in view of a manufacturing cost and efficiency. That is, it is preferable that a universal DRAM for mobile equipment use and general use is manufactured and then fixed to the mobile equipment use or the general use in a final process (a packaging process).

SUMMARY OF INVENTION

It is, therefore, an object of the present invention to provide a semiconductor memory device that can be fixed to a DRAM for use in a mobile equipment or for a general use.

Another object of the present invention is to provide a semiconductor memory device that can be used as a general DRAM even after an oscillation pulse generator is adjusted so as to use it as DRAM for use in mobile equipment.

A further another object of the present invention is to provide a fuse box having an output that is not associated with an internal fuse state, which is cut according to an external signal used in a universal DRAM.

In accordance with an aspect of the present invention, there is provided a fuse box including: at least one fuse; a power supplying part for supplying a predetermined voltage to one end of the fuse; a detector, connected to the other end of the fuse, for detecting a connection state of the fuse; and a recovery switch, connected to a contact point between the detector and the fuse, for supplying the predetermined voltage to the detector in response to an external recovery signal.

In accordance with another aspect of the present invention, there is provided a semiconductor memory device including: a TCSR generator for generating an oscillation pulse for TCSR mode; an SSR generator for generating an oscillation pulse for SSR mode; a fuse box for adjusting a period of the oscillation pulse of the SSR generator; a multiplier for multiplying the period of the oscillation pulse of the SSR generator; and an oscillation pulse selector for selecting a signal having a shorter period from the oscillation signal of the TCSR generator and the output signal of the multiplier, wherein the fuse box has an output independent of an internal fuse state when a recovery signal is inputted.

In accordance with a further another aspect of the present invention, there is provided a method for setting a mode of a semiconductor memory device having a TCSR generator and an SSR generator. The method includes the steps of: measuring a period of an oscillation pulse of the TCSR generator; correcting a period of an oscillation pulse of the SSR generator; testing a TCSR oscillation function of the semiconductor memory device; fixing the mode to a TCSR memory device if satisfying a demanded function as the test result; and recovering the corrected period of the oscillation pulse of the SSR generator if not satisfying the demanded function, and fixing the mode to an SSR memory device

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
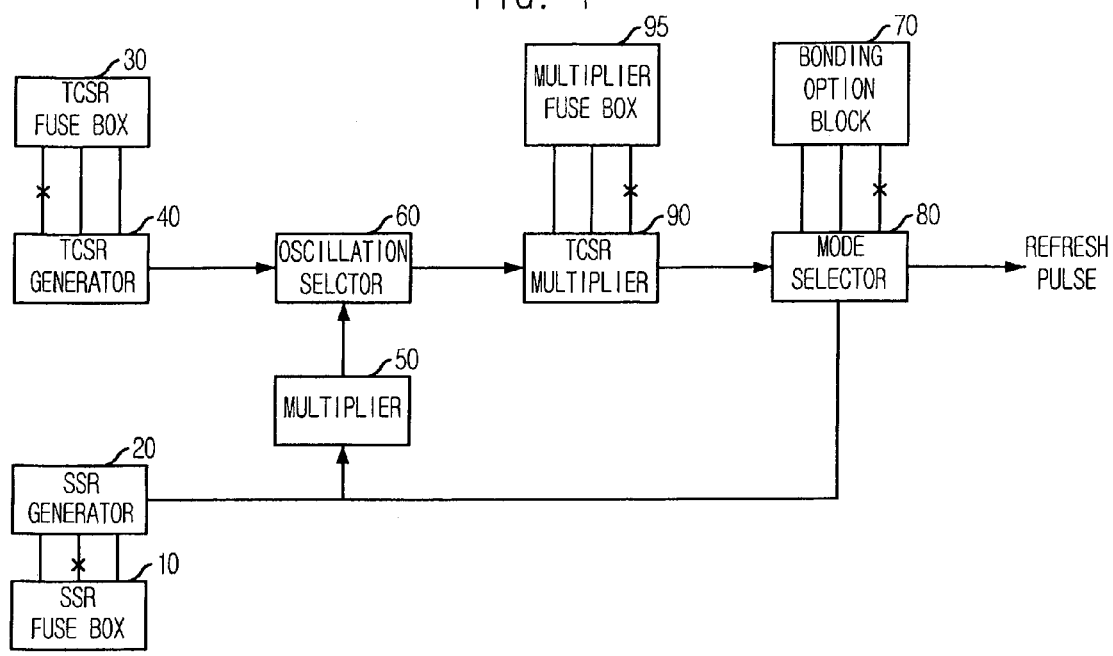
FIG. 1 is a block diagram of a refresh oscillation pulse generator of a semiconductor memory device in accordance with the present invention.

FIG. 1 is a block diagram of a refresh oscillation pulse generator of a semiconductor memory device in accordance with the present invention.

A semiconductor memory device in accordance with a preferred embodiment of the present invention includes: a TCSR generator 40 for generating an oscillation pulse for TCSR mode; a TCSR fuse box 30 for adjusting an oscillation pulse period of the TCSR generator 40; an SSR generator 20 for generating an SSR mode oscillation pulse; an SSR fuse box 10 for adjusting an oscillation pulse period of the SSR generator 20; an SSR multiplier 50 for multiplying the oscillation pulse period of the SSR generator 20; an oscillation pulse selector 60 for selecting a signal having a shorter period from an oscillation signal of the TCSR generator 40 and an output signal of the SSR multiplier 50; a TCSR multiplier 90 for receiving an oscillation pulse of the oscillation pulse selector 60 and multiplying a period of the oscillation pulse; a multiplier fuse box 95 for adjusting a multiple of the period of the TCSR multiplier 90; a mode selector 80 for selecting one signal from the output signal of the oscillation pulse selector 60 and the oscillation pulse of the SSR generator 20; and a bonding option block 70 for controlling the mode selector 80. If the SSR fuse box 10 receives a recovery signal, the semiconductor memory device has the same output as a case when all fuses are connected independently of an internal fuse state.

The TCSR generator 40 generates the oscillation pulse whose period becomes short as the temperature rises. The TCSR generator 40 includes a temperature sensing circuit for measuring a current temperature and a basic oscillation circuit for adjusting an oscillation period according to the measured temperature. The temperature sensing circuit compares an output of a generator, which has almost no variation of the oscillation period according to the temperature, with an output of the generator, whose oscillation period is rapidly lengthened according to the temperature, and the temperature sensing circuit determines the current temperature according to the deviation therebetween.

The TCSR generator 40 has a great variation in the oscillation frequency, depending on products. Therefore, the TCSR fuse box 30 is used to correct the oscillation frequency of the basic oscillation circuit after the fabrication of the device. In this manner, a final product is completed. Since the fuse box 30 is used, the correction of the oscillation frequency with respect to the basic oscillation circuit is achieved not stepwise but continuously.

The SSR generator 20 outputs the oscillation pulse whose oscillation period is not almost changed according to the temperature. If the semiconductor memory device in accordance with the present invention is manufactured as the general DRAM, the oscillation pulse is used as the self refresh oscillation pulse in the SSR mode in which the period is fixed.

The multiplier 50 outputs the oscillation pulse given by multiplying the period of the oscillation pulse outputted from the SSR generator 20.

The oscillation pulse selector 60 is a module that operates when the semiconductor memory device is manufactured as the DRAM for use in mobile equipment. The oscillation pulse selector 60 compares a period of the oscillation pulse of the multiplier 50 with a period of the oscillation pulse of the TCSR generator 40 and selects an oscillation pulse having a shorter period. This process is performed in order for maintaining a minimum refresh frequency necessary for storing the data in the memory cell even when the temperature falls to any level and also for securing a maximum oscillation period using the oscillation pulse, of the SSR generator having small variation in temperature and process deviation.

The mode selector 80 selects one of the oscillation pulses outputted from the SSR generator 20 and the oscillation pulse selector 60 and outputs the selected oscillation pulse as the self refresh oscillation pulse. The mode selector 80 selects a mode according to a setup of the bonding option block 70 in a final manufacturing step of the semiconductor memory device (which is mainly performed together with a bonding step). The mode selector 80 simply functions as a fixed path during the operation of the semiconductor memory device.

It is preferable that the bonding option block 70 is configured with a kind of a fuse box having at least one fuse. The bonding option block 70 is set up according to a signal (for example, a fuse cutting) applied from an outside in a final device manufacturing step (mainly a bonding step) and it fixes an oscillation pulse transfer path of the mode selector 80. Also, a set value of the bonding option block 70 can be used as the recovery signal in the SSR fuse box 10.

The TCSR multiplier 90 outputs a signal given by multiplying the period of the output signal of the oscillation pulse selector 60 by means of the multiplier fuse box 95. Also, the multiplier fuse box 95 is set up according to the period of the basic oscillation pulse of the TCSR generator 40 during the setting step after the fabrication of the semiconductor memory device.

The SSR fuse box 10 adjusts the oscillation frequency of the SSR generator 20. In the case of the general DRAM, it is usual that the SSR fuse box 10 is used without modification. Meanwhile, in the case of the DRAM for use in mobile equipment, the SSR fuse box 10 is modified for setup of the maximum period limit.

Figure 2:
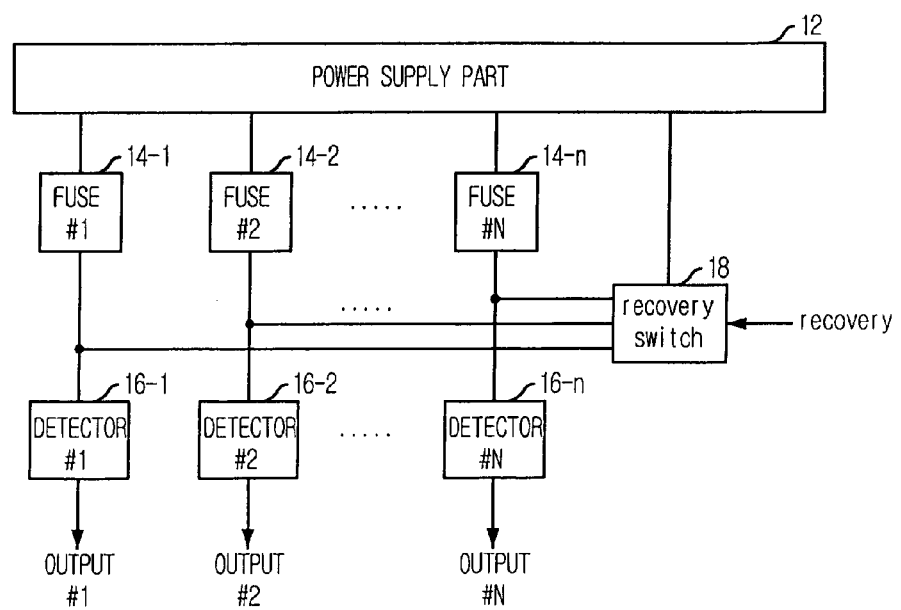
FIG. 2 is a block diagram of a fuse box in accordance with the present invention.

The SSR fuse box 10 performs a characteristic function of the present invention. As shown in FIG. 2, the SSR fuse box 10 includes: at least one fuse 14; a power supply part 12 for supplying a predetermined voltage to one end of the fuse 14; at least one detector 16, connected to the other end of the fuse 14, for detecting a connection state of the fuse 14 and outputting the detected state; and a recovery switch 18, connected to a contact point between the detector 16 and the fuse 14, for supplying a predetermined voltage to the detector 16 when it receives the recovery signal.

Figure 3:
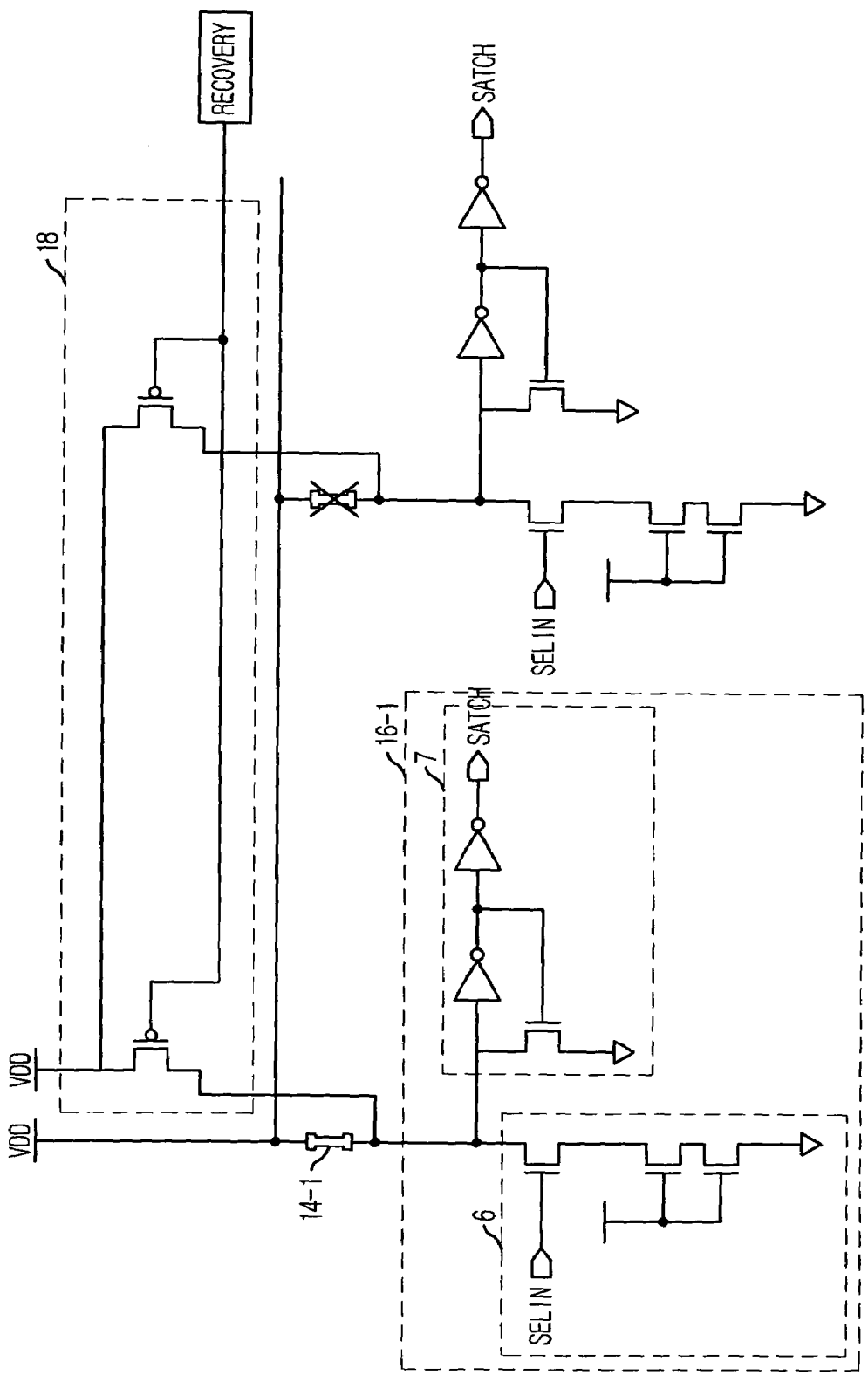
FIG. 3 is a circuit diagram of a fuse box in accordance with the present invention.

FIG. 3 is a circuit diagram of the SSR fuse box 10 in accordance with an embodiment of the present invention.

Referring to FIG. 3, the power supply part 12. as depicted in FIG. 2. supplies a predetermined voltage to the detector 16 through the fuse 14-1. In FIG. 3, the fuse 14-1 is connected to a power supply voltage VDD having a small voltage variation.

The recovery switch 18 is configured with MOS transistors having gates receiving the recovery signal and sources or drains connected to the power supply voltage VDD. One of the MOS transistors has a source or drain connected to the detector 16-1.

The detector 16-1 includes: a driving unit 6 for receiving an external driving signal SELIN and setting an initial driving value; and an output unit 7 for toggling the initial driving value when the fuse is disconnected.

The external driving signal SELIN is applied as a short and single oscillation pulse at an early operation of the device and is inputted as an initial low level to the output unit 7. The output unit 7 includes an internal latch. The output unit 7 outputs an output signal SATCH of a low level at an early operation of the device and outputs the output signal SATCH of a high level when the fuse 14 is connected.

The semiconductor memory device in accordance with an embodiment of the present invention includes the TCSR generator and its related module, and the SSR generator and its related module. In the final device manufacturing step, the mode of the semiconductor memory device is fixed to the TCSR memory for use in mobile equipment or the general SSR memory.

A setting method for fixing the mode of the semiconductor memory device in accordance with an embodiment of the present invention includes: a S20 step of measuring the period of the oscillation pulse of the TCSR generator 40; a S30 step of correcting the period of the oscillation pulse of the SSR generator 20; a S40 step of testing the TCSR oscillation function of the semiconductor memory device; a S60 step of fixing the mode to the TCSR memory device if satisfying the demanded function; and a S80 step of recovering the corrected period of the oscillation pulse of the SSR generator 20 if not satisfying the demanded function, and fixing the mode to the SSR memory device.

The period of the oscillation pulse of the TCRS generator 40 has a large manufacturing deviation up to several times. In the S20 step, the period of the oscillation pulse of the TCSR generator 40 in the manufactured device is measured. After the measurement, the multiplier fuse box 95 and the TCSR fuse box 30 are set up to meet the requirement of the TCSR. The period of the oscillation pulse of the TCSR generator 40 is finely adjusted using the TCSR fuse box 30. A multiple to multiply the output of the oscillation pulse selector 60 is changed through the multiplier fuse box 95. In this manner, the TCSR generator 40 can have the oscillation period required at a predetermined temperature.

If the period of the oscillation pulse of the TCSR generator 40 is completely correctly, the period of the oscillation pulse of the SSR generator 20 is corrected (the S30 step). This step is to change the period of the oscillation pulse of the SSR generator 20 used to obtain the maximum refresh period in the TCSR mode in order to secure the maximum period of the TCSR as much as the changed multiple of the TCSR multiplier 90.

By the above-described steps, the universal semiconductor memory device is completely manufactured into the TCSR memory device for use in mobile equipment, except the final bonding step. Then, whether the semiconductor memory device operates suitably as the TCSR memory device is tested (the S40 step). If so, the bonding option block 70 of the semiconductor memory device is adjusted and the bonding process is performed in a state that is set as the TCSR memory device, thereby completing the fabrication of the semiconductor memory device.

If the semiconductor memory device does not meet the requirement of the TCSR memory device but it operates properly as the general SSR memory device, a S80 step of manufacturing the semiconductor memory device as the SSR memory device is performed.

In order to change the semiconductor memory device into the SSR memory device, the corrected period of the oscillation pulse of the SSR generator 20 must be recovered. In accordance with the present invention, the recovery process is achieved by simply applying the recovery signal to the SSR fuse box 10. Since the SSR fuse box 10 has the structure shown in FIG. 2, a value before the fuse is disconnected is outputted when the recovery signal is applied.

The TCSR multiplier may be disposed at a stage next to the mode selector 80. Also, the period of the SSR oscillation pulse selected by the mode selector 80 can be multiplied by a preset multiple. If the TCSR multiplier multiplies the period of the SSR oscillation pulse, the multiplier fuse box must have the recovery function depending on the recovery signal, just like the SSR fuse box.

According to the present invention, the universal DRAM can be fixed to the DRAM for use in mobile equipment or for a general use in the final manufacturing step, so that the manufacturing steps can be simplified into one step.

Also, when the universal DRAM cannot be employed as the DRAM for use in mobile equipment, it may be used as the general DRAM, thereby improving the yield of the semiconductor memory device.

Further, even when the fuse is disconnected in the setting step, the fuse box can be recovered into the initial state.

The present application contains subject matter related to Korean patent application No. 2004-49957, filed in the Korean Patent Office on Jun. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a TCSR (temperature controlled self refresh) generator for generating an oscillation pulse for TCSR mode;
   an SSR generator for generating an oscillation pulse for SSR (standard self refresh) mode;
   a fuse box for adjusting a period of the oscillation pulse of the SSR generator;
   a multiplier for multiplying the period of the oscillation pulse of the SSR generator; and
   an oscillation pulse selector for selecting a signal having a shorter period from the oscillation pulse for the TCSR mode and an output signal of the multiplier,
   wherein the fuse box has an output independent of an internal fuse state when a recovery signal is inputted.

2. The semiconductor memory device as recited in claim 1, further comprising a mode selector for selecting one signal from the output signal of the oscillation pulse selector and the oscillation pulse an for SSR mode.

3. The semiconductor memory device as recited in claim 2, further comprising a bonding option block for controlling selection operation of the mode selector.

4. The semiconductor memory device as recited in claim 1, further comprising a TCSR fuse box for adjusting the period of the oscillation pulse of the TCSR generator.

5. The semiconductor memory device as recited in claim 2, further comprising a TCSR multiplier, disposed on a signal transfer path between the oscillation pulse selector and the mode selector, for receiving the output signal of the oscillation pulse selector and multiplying a period of the output signal of the oscillation pulse selector.

6. The semiconductor memory device as recited in claim 5, further comprising a multiplier fuse box for adjusting a multiple of a period of the TCSR multiplier.

7. A method for setting a mode of a semiconductor memory device having a TCSR (temperature controlled self refresh) generator and an SSR (standard self refresh) generator, the method comprising the steps of:
   (a) measuring a period of an oscillation pulse of the TCSR generator;
   (b) correcting a period of an oscillation pulse of the SSR generator;
   (c) testing a TCSR oscillation function of the semiconductor memory device;

(d) fixing the mode to a TCSR memory device when the semiconductor memory device performs the TCSR oscillation function suitably; and (e) recovering the corrected period of the oscillation pulse of the SSR generator when the semiconductor memory device performs the TCSR oscillation function unsuitably, and fixing the mode to an SSR memory device.

8. The method as recited in claim 7, further comprising, after the step (a), the step (f) of correcting the period of the oscillation pulse of the TCSR generator.

9. The method as recited in claim 8, wherein the step (f) is to set a fuse box for adjusting the period of the oscillation pulse of the TCSR generator.

10. The method as recited in claim 7, wherein the step (b) is to set a fuse box for applying a setting signal to the SSR generator.

11. The method as recited in claim 7, wherein the semiconductor memory device further includes a mode selector for fixing an operation mode to a TCSR mode or an SSR mode, and the step (d) is to set a fuse box for applying a setting signal to the mode selector.

12. The method as recited in claim 10, wherein the semiconductor memory device further includes a mode selector for fixing an operation mode to a TCSR mode or an SSR mode, and the step (e) includes the steps of:

(e1) applying a recovery signal to the fuse box; and (e2) setting the fuse box for applying a setting signal to the mode selector.

13. The semiconductor memory device as recited in claim 1, wherein the fuse box includes:

a plurality of fuses;

a power supplying part for supplying a predetermined voltage to the fuses through first terminals of the fuses;

a plurality of detectors, each of which is connected to a second terminal of the corresponding fuse, for detecting a connection state of the fuses; and a recovery switch, connected to the second terminals of the fuses, for supplying the predetermined voltage to the detectors in response to an external recovery signal.

14. The semiconductor memory device as recited in claim 13, wherein outputs of the fuse box are input to the SSR generator.

15. The semiconductor memory device as recited in claim 13, wherein the recovery switch is a MOS transistor having gate receiving the external recovery signal, a first terminal connected to the predetermined voltage, and a second terminal connected to the detector.

16. The semiconductor memory device as recited in claim 13, wherein each of the detectors includes:

a driving unit for receiving an external driving signal and setting an initial driving value; and an output unit for toggling for toggling the initial driving value when the corresponding fuse is cut.

* * * * *